United States Patent
Lee

[19]

[11] Patent Number: 6,060,361
[45] Date of Patent: May 9, 2000

[54] METHOD FOR PREVENTING DOPANT DIFFUSION IN DUAL GATE DEVICE

[75] Inventor: Tong-Hsin Lee, Taipei Hsien, Taiwan

[73] Assignee: United Silicon Incorporated, Hsinchu, Taiwan

[21] Appl. No.: 09/206,187

[22] Filed: Dec. 4, 1998

[30] Foreign Application Priority Data

Oct. 12, 1998 [TW] Taiwan ................................. 87116873

[51] Int. Cl.[7] ...................... H01L 21/336; H01L 21/8238
[52] U.S. Cl. ......................... 438/283; 438/199; 438/592; 438/653; 438/655
[58] Field of Search .................................... 438/283, 592, 438/642, 643, 652, 653, 655, 657, 669, 682, 199, 229

[56] References Cited

U.S. PATENT DOCUMENTS

| | | |
|---|---|---|
| 5,093,710 | 3/1992 | Higuchi .................................. 438/643 |
| 5,232,871 | 8/1993 | Ho ......................................... 438/653 |
| 5,733,816 | 3/1998 | Iyer et al. .............................. 438/648 |
| 5,780,356 | 7/1998 | Kim ...................................... 438/643 |
| 5,780,908 | 7/1998 | Sekiguchi et al. ..................... 257/751 |
| 5,817,175 | 10/1998 | Iyer ....................................... 117/104 |
| 5,856,237 | 1/1999 | Ku ......................................... 438/683 |

*Primary Examiner*—Michael Trinh
*Attorney, Agent, or Firm*—J.C. Patents Jiawei Huang

[57] ABSTRACT

A method for preventing the diffusion of dopants in a dual gate device includes the steps of providing a semiconductor substrate having wells and isolating structures thereon, and then forming a gate oxide layer over the well regions. Thereafter a polysilicon layer is formed over the gate oxide layer, and then a first conductive layer is formed over the polysilicon layer. Subsequently, a plasma treatment using gaseous nitrogen or gaseous ammonia is conducted to form a barrier layer. Finally, a second conductive layer is formed over the barrier layer.

9 Claims, 3 Drawing Sheets

6,060,361

METHOD FOR PREVENTING DOPANT DIFFUSION IN DUAL GATE DEVICE

CROSS-REFERENCE TO RELATED APPLICATION

This application claims the priority benefit of Taiwan application Ser. No. 87116873, filed Oct. 12, 1998, the full disclosure of which is incorporated herein by reference.

BACKGROUND OF THE INVENTION

1. Field of Invention

The present invention relates to a method of manufacturing a semiconductor device. More particularly, the present invention relates to a method for preventing the diffusion of dopants in a dual gate device.

2. Description of Related Art

Mixed mode devices such as the one that incorporates logic devices into DRAM circuits are becoming more common. To obtain even lower operating voltages, CMOS having dual gates are often formed. Self-aligned silicide processes are frequently employed in the fabrication of dual gates. The silicide layer thus formed the capacity to lower the resistance between the gate terminal and the diffusion layer as well as to connect the $N^+$-type polysilicon gate terminal with the $P^+$-type polysilicon gate terminal. However, it is difficult for a DRAM connected via a silicide layer to maintain good refresh properties. Consequently, the dual gates of an embedded DRAM must be manufactured with polycide. However, the $N^-$ dopants or $P^-$ dopants in polycide gates can easily diffuse into each other leading to a shift in the threshold voltage. Therefore, a barrier layer is normally formed between the polysilicon layer and the polycide layer to limit the quantity of dopant cross-diffusion.

FIGS. 1A through 1C are schematic, cross-sectional views showing the progression of manufacturing steps according to a conventional method of fabricating a dual gate device.

First, as shown in FIG. 1A, a substrate 10 having two neighboring wells 14 and isolating structures 12 thereon is provided. Thereafter, thermal oxidation is used to form a gate oxide layer 16 over the substrate 10. Then, chemical vapor deposition (CVD) is used to form a polysilicon layer 18 over the gate oxide layer 16.

Next, as shown in FIG. 1B. a barrier layer 20 is formed over the polysilicon layer 18. The barrier layer 20 can be formed by first depositing a silicon-rich tungsten silicide layer ($WSi_x$) over the polysilicon layer 18 using chemical vapor deposition (CVD). Then, tungsten nitride ($WN_x$) or titanium nitride ($TiN_y$) is deposited over the tungsten silicide layer by sputtering. The tungsten silicide layer together with the tungsten nitride or the tungsten silicide layer together with the titanium nitride layer forms the barrier layer 20.

Next, as shown in FIG. 1C, a conductive layer 22 is formed over the barrier layer 20. The conductive layer 22 can be a tungsten-rich silicide layer formed by chemical vapor deposition (CVD). Alternatively, the conductive layer 22 can be a tungsten layer formed by sputtering or chemical vapor deposition (CVD).

In the subsequent step, the P-type gate and the N-type gate are patterned, and then the source/drain regions are formed in the substrate to complete the fabrication of a dual gate transistor.

Although tungsten nitride and titanium nitride are capable of preventing the diffusion of boron ions, both tungsten nitride and titanium nitride are formed by a sputtering method. On the other hand, the polysilicon layer and the tungsten silicide layer are formed by chemical vapor deposition (CVD). Hence, reacting stations have to be switched twice during the fabrication of a dual gate transistor, thereby increasing cycle time and lowering the yield.

In light of the foregoing, there is a need to provide a method for fabricating a dual gate transistor capable of preventing the diffusion of dopants and having a shorter cycle time.

SUMMARY OF THE INVENTION

Accordingly, the present invention provides a method for preventing dopant diffusion in a dual gate device. The method relies on performing a plasma treatment using either gaseous nitrogen or gaseous ammonia to transform a tungsten silicide layer into an amorphous tungsten nitride layer, which has a much better capacity for blocking the diffusion of dopants. Furthermore, except for the process of forming a gate oxide layer over the substrate, all the other layers can be formed using chemical vapor deposition (CVD). Hence, almost the entire gate structure can be fabricated inside the reaction chamber of the one station.

To achieve these and other advantages and in accordance with the purpose of the invention, as embodied and broadly described herein, the invention provides a method for preventing the diffusion of dopants in a dual gate device. The method includes the steps of providing a semiconductor substrate having wells and isolating structures thereon, and then forming a gate oxide layer over the well regions. Thereafter, a polysilicon layer is formed over the gate oxide layer, and then a first conductive layer is formed over the polysilicon layer. Subsequently, a plasma treatment using gaseous nitrogen or gaseous ammonia is carried out to form an amorphous metal silicon nitride layer. The metal silicon nitride layer serves as a barrier layer blocking the diffusion of doped ions. Finally, a second conductive layer is formed over the metal silicon nitride layer.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
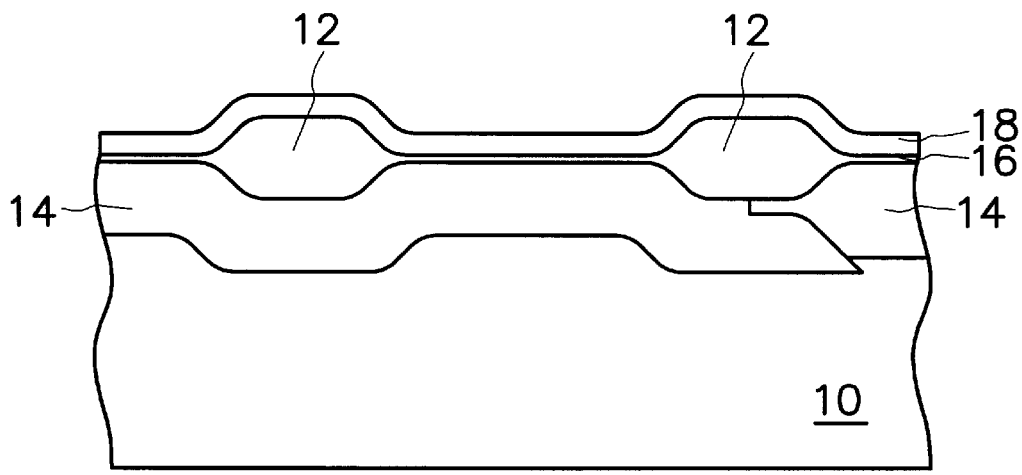
FIGS. 1A through 1C are schematic, cross-sectional views showing the progression of manufacturing steps according to a conventional method of fabricating a dual gate device.
Figure 1B:
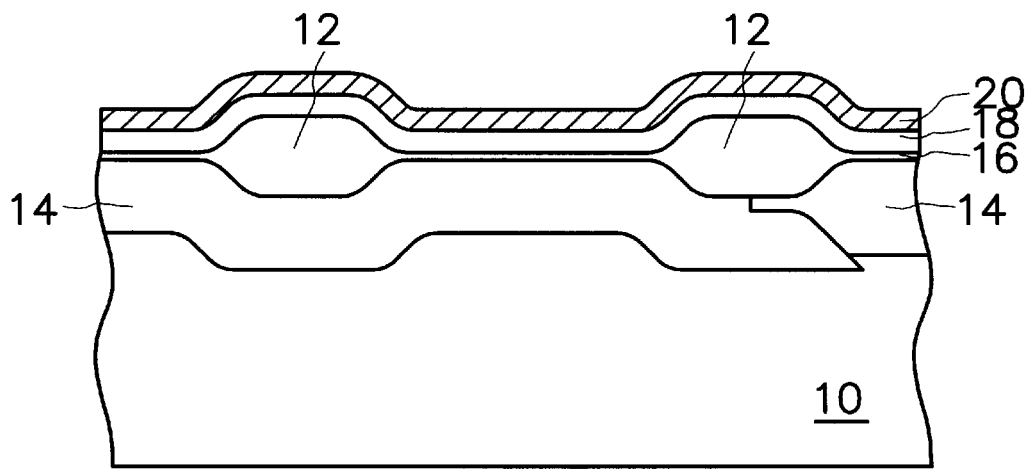
Figure 1C:
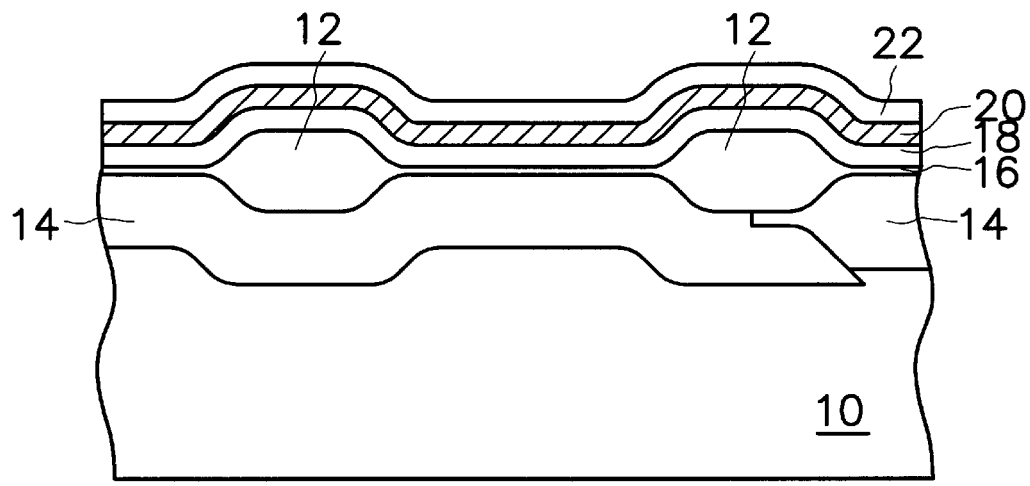

Reference will now be made in detail to the present preferred embodiments of the invention, examples of which are illustrated in the accompanying drawings. Wherever possible, the same reference numbers are used in the drawings and the description to refer to the same or like parts.

FIGS. 2A through 2D are schematic, cross-sectional views showing the progression of manufacturing steps according to one preferred embodiment of this invention for fabricating the gates of a dual gate device such that the diffusion of dopants in the gate area is prevented.

Figure 2A:
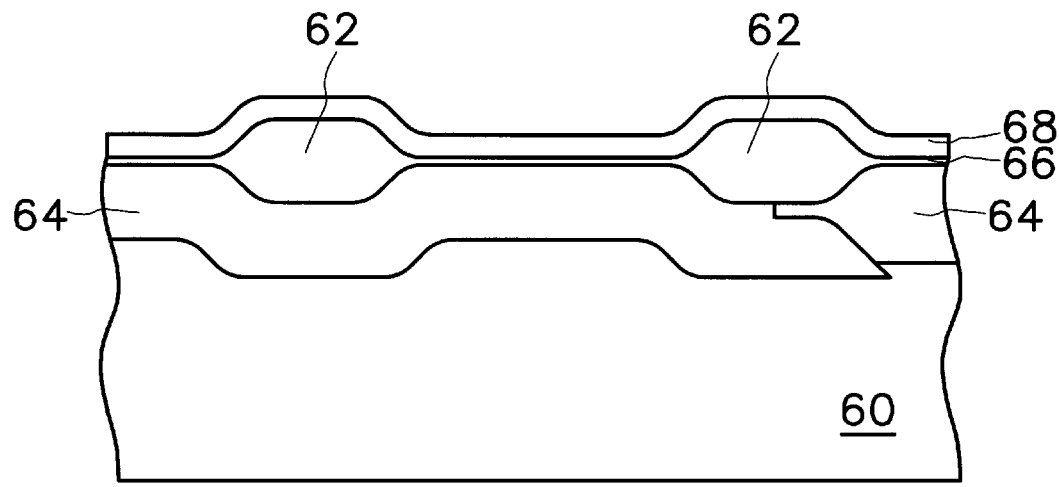
FIGS. 2A through 2D are schematic, cross-sectional views showing the progression of manufacturing steps according to one preferred embodiment of this invention for fabricating the gates of a dual gate device such that the diffusion of dopants in the gate area is prevented.

First, as shown in FIG. 2A, isolating structures 62 are formed on a substrate 60, and then wells 64 are formed within the substrate 60. Next, a gate oxide layer 66 is formed over the substrate 60 by thermal oxidation. Thereafter, a polysilicon layer 68 is formed over the gate oxide layer 66 using, for example, low-pressure chemical vapor deposition (LPCVD).

Figure 2B:
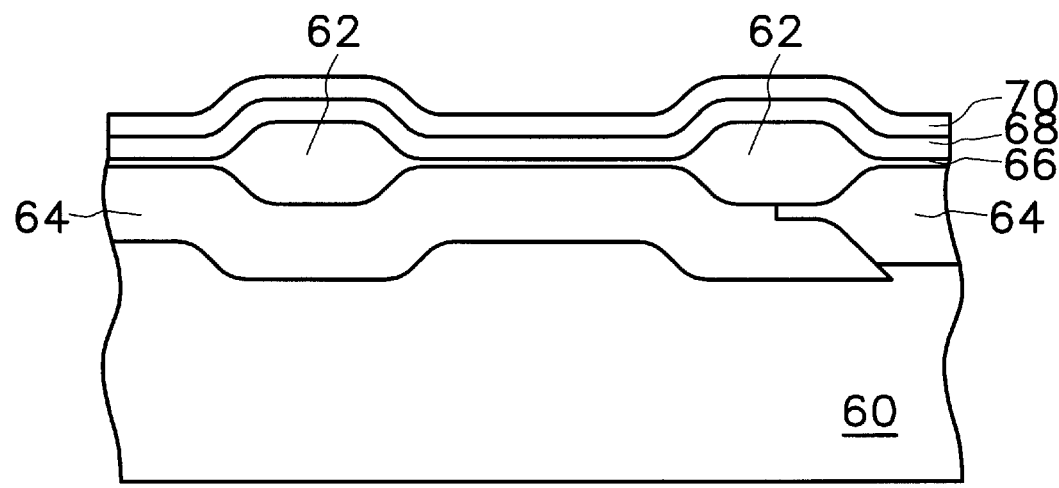

Next, as shown in FIG. 2B, a first conductive layer 70 is formed over the polysilicon layer 68. The first conductive layer 70 is preferably a silicon-rich, tungsten silicide layer having a thickness of about 100Å. The silicon-rich, tungsten silicide layer can be formed using a low-pressure chemical vapor deposition (LPCVD) method with temperature set between about 300° C. and 400° C., pressure between about 0.3 and 1.0 Torr, and hexafluoride and silane used as reactive gases.

Figure 2C:
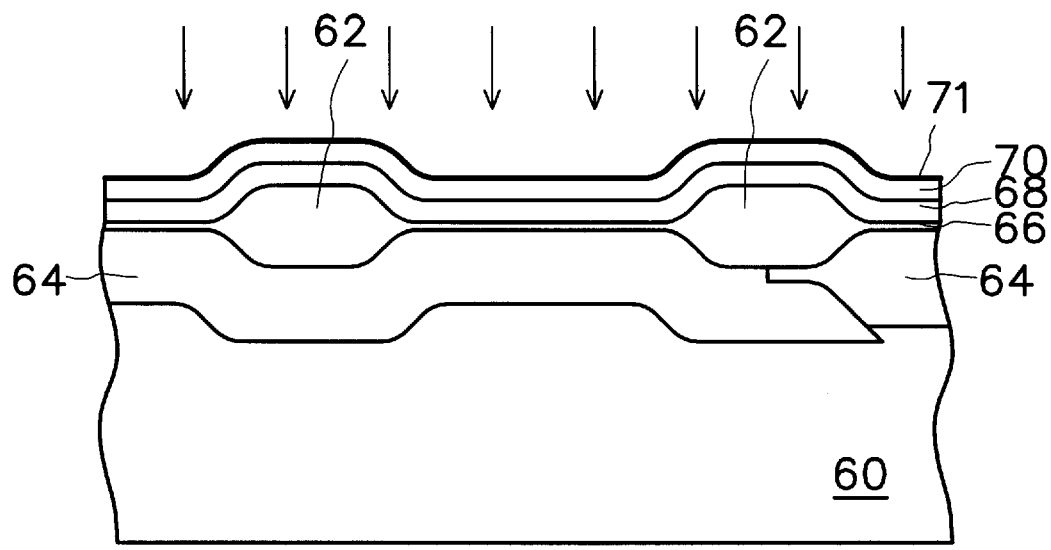

Next, as shown in FIG. 2C. a plasma treatment is carried out using gaseous nitrogen or ammonia so that the tungsten silicide within the first conductive layer 70 is transformed into a tungsten silicon nitride barrier layer 71, which also has an amorphous lattice structure. The plasma treatment is performed at an operating pressure of about 2 mTorr and power rating of about 300W to 500W.

Figure 2D:
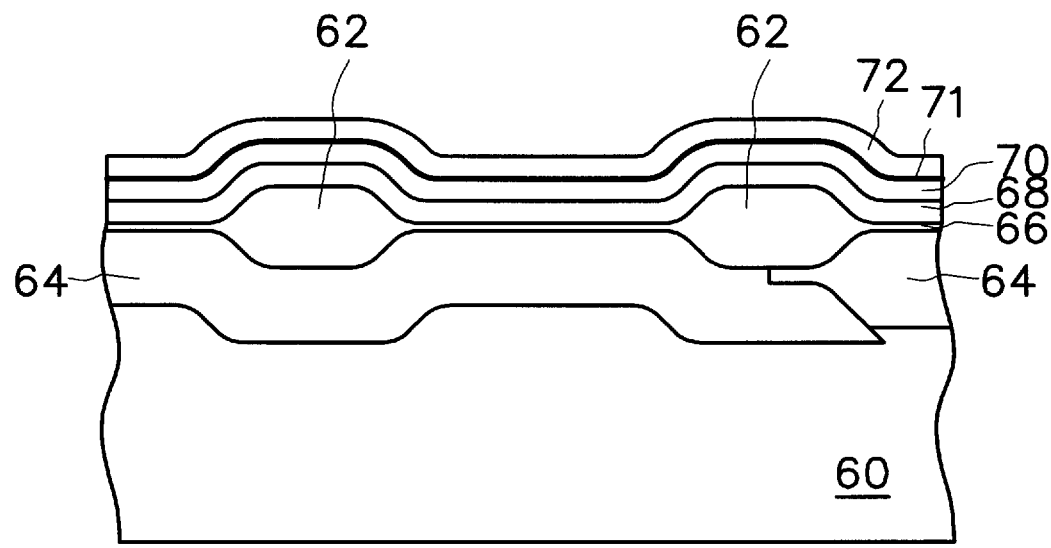

Next, as shown in FIG. 2D, a second conductive layer 72 is formed over the barrier layer 71 using, for example, low-pressure chemical vapor deposition (LPCVD). The second conductive layer 72 is preferably a tungsten-rich, tungsten silicide layer so that electrical resistance can be further reduced.

In the subsequent step, the P-type gate and the N-type gate are patterned, and then the source/drain regions are formed in the substrate to complete the fabrication of a dual gate device.

In summary, the advantages of applying the method of this invention to fabricate a dual gate device include:

1. The entire process of fabricating the gates of a dual gate device can be carried out in one reacting station. Since there is no need to switch stations, production time can be saved.

2. The tungsten silicon nitride layer formed by the plasma treatment has an amorphous internal structure. Therefore, additional paths for diffusion are created inside the tungsten silicon nitride layer for impurities such as boron or arsenic ions inside the polysilicon layer. Ultimately, the diffusion of impurities from the tungsten silicide layer to neighboring devices is slowed down.

3. Internal stress created between tungsten silicide and tungsten silicon nitride is smaller than that between tungsten silicide and tungsten nitride or titanium nitride. Hence, the possibility of peeling of tungsten silicide layer in subsequent thermal operation is greatly reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for preventing dopant diffusion in a dual gate device, comprising the steps of:

providing a substrate having an isolating structure and a well thereon;

forming a gate oxide layer on the substrate;

forming a polysilicon layer on the gate oxide layer;

forming a silicon-rich tungsten suicide layer serving as a first conductive layer on the polysilicon layer;

performing a plasma treatment on the silicon-rich tungsten silicide layer to transfer at least a top portion of the tungsten silicide layer into a tungsten silicon nitride layer serving as a barrier layer; and forming a second conductive layer on the barrier layer.

2. The method of claim 1, wherein the step of forming the first conductive layer includes using chemical vapor deposition.

3. The method of claim 1, wherein the step of conducting the plasma treatment includes using gaseous nitrogen as plasma gas.

4. The method of claim 1, wherein the step of conducting the plasma treatment includes using gaseous ammonia as plasma gas.

5. The method of claim 1, wherein the plasma treatment is carried out at an operating pressure of about 2 mTorr and a power rating of between about 300W and 500W.

6. The method of claim 1, wherein the barrier layer has an amorphous internal structure.

7. The method of claim 1, wherein the step of forming the second conductive layer includes using chemical vapor deposition.

8. The method of claim 1, wherein the step of forming the second conductive layer includes growing a tungsten-rich, tungsten silicide layer.

9. The method of claim 1, wherein after the step of forming the second conductive layer over the barrier layer, further includes forming a P-type gate, an N-type gate and a source/drain region.

* * * * *